United States Patent [19]

Ozawa et al.

[11] 4,198,578
[45] Apr. 15, 1980

[54] TRANSISTOR SWITCHING CIRCUITS WITH SHORTENED RESPONSE TIMES

[75] Inventors: Akio Ozawa; Masaharu Sakamoto; Hideo Ito, all of Tokyo, Japan

[73] Assignee: Pioneer Electronic Corporation, Tokyo, Japan

[21] Appl. No.: 900,375

[22] Filed: Apr. 26, 1978

[30] Foreign Application Priority Data

Apr. 28, 1977 [JP] Japan .............................. 52-54982[U]

[51] Int. Cl.$^2$ ...................... H03K 17/04; H03K 17/60
[52] U.S. Cl. ................................... 307/246; 307/293; 307/362; 307/263; 328/185
[58] Field of Search ............... 307/246, 253, 254, 263, 307/354, 362, 293; 328/185

[56] References Cited

U.S. PATENT DOCUMENTS

| | | | |
|---|---|---|---|
| 3,431,471 | 3/1969 | Aviander | 307/293 X |
| 3,694,672 | 9/1972 | Buyak | 307/246 X |

*Primary Examiner*—John Zazworsky
*Attorney, Agent, or Firm*—Sughrue, Rothwell, Mion, Zinn and Macpeak

[57] ABSTRACT

The response time of an ordinary or differential transistor switching circuit controlled by the charging of a capacitor $C_1$ is shortened by rapidly charging the capacitor through a transistor $Q_6$ connected in parallel with the charging resistor $R_1$ of the capacitor. The transistor is rendered conductive before the differential switching region is reached in response to the capacitor charge reaching a predetermined level, whereby the charging curve thereafter follows a steep rise to sharply reduce the switching time.

3 Claims, 7 Drawing Figures

(POTENTIAL AT A MINUS POTENTIAL AT B)

TRANSISTOR SWITCHING CIRCUITS WITH SHORTENED RESPONSE TIMES

BACKGROUND OF THE INVENTION

This invention relates to a switching circuit having a shortened response time determined by the charging rate of a capacitor.

A conventional differential switching circuit employed in a muting circuit, a noise eliminating circuit, or the like in a radio receiver is shown in FIG. 1. When a passage control signal is applied over line 2 to a switching circuit 1, an input signal applied to the input terminal IN is passed through to the output terminal OUT. In contrast, when an interruption signal is applied over line 3, a signal applied to terminal IN is interrupted or blocked by the switching circuit 1, and not delivered to terminal OUT.

If the resistances of biasing resistors $R_3$ and $R_4$ are selected so that when no voltage is applied to a switching terminal (C) at the base of transistor $Q_1$, the potential at a point (B) is higher by at least 4 KT/q (where K is the Boltzman constant, T is the absolute temperature, and q is the electron charge) than the potential at point (A), then transistor $Q_2$ is rendered conductive while transistor $Q_3$ is rendered non-conductive. Accordingly, only the passage control signal on line 2 is provided, and a signal applied to the input terminal IN is passed through to the output terminal OUT. When a voltage $V_1$ is applied to the switching terminal (C), point (B) has a potential $(V_1+V_{BE1})$ where $V_{BE1}$ is the base-emitter voltage of transistor $Q_1$. If the value of $V_1$ is set so that the potential Va at point (A) is higher by at least 4 KT/q than the potential at point (B), then transistor $Q_3$ is rendered conductive, while transistor $Q_2$ is cut off. Accordingly, an interruption control signal is provided on line 3, and the input signal is blocked in the switching circuit 1.

When the application of voltage $V_1$ to the switching terminal (C) is suspended, the potential at point (B) builds up to the supply voltage +Vcc after a time period determined by the values of resistor $R_1$ and capacitor $C_1$, as shown by curve (a) in FIG. 6. If the time interval during which the potential at point (B) changes from $(V_1+V_{BE1})$ to $(Va-4\ KT/q)$ is represented by $t_0$, then transistors $Q_3$ and $Q_2$ are maintained conductive and non-conductive, respectively, during the time $t_0$, and accordingly the interruption control signal remains on line 3 during such time. If the time interval during which the potential at point (B) changes from $(Va-4\ KT/q)$ to $(Va+4\ KT/q)$ is referred to as the differential switching period and is represented by $t_1$, then collector currents $I_{C1}$ and $I_{C2}$ simultaneously flow in the transistors $Q_2$ and $Q_3$, respectively, during such time because it falls in a linear region as shown in FIGS. 2 and 6. After time $t_1$ transistor $Q_2$ is rendered conductive while transistor $Q_3$ is cut off, whereby only the passage control signal appears on line 2.

As is apparent from the above description, a problem exists during the differential switching period $t_1$ because during such time both the passage control and interruption control signals are generated, which leads to the erroneous operation of the switching circuit 1.

An ordinary transistor switching circuit employing a conventional capacitor charging circuit is shown in FIG. 3. The breakdown voltage of the Zener diode $D_{Z1}$ is represented by $V_{DZ1}$, and the base-emitter voltage of transistor $Q_5$ is represented by $V_{BE5}$. Upon the closure of switch $SW_1$, the potential at point (B) is increased to $(V_{DZ1}+V_{BE5})$ over a time period determined by the values of resistor $R_1$ and capacitor $C_1$, as shown by curve (a) in FIG. 7. When the potential at point (B) exceeds $V_{DZ1}$, current begins to flow in transistor $Q_5$ and the potential at terminal (D) begins to drop. When the potential at point (B) reaches $(V_{DZ1}+V_{BE5})$ transistor $Q_5$ is rendered fully conductive, whereby the voltage at terminal (D) is substantially equal to the breakdown voltage $V_{DZ1}$ of the Zener diode $D_{Z1}$. The output voltage at terminal (D) does not have a steep drop, however, as shown by curve (b) in FIG. 7, because of the relatively slow build up characteristic of the potential at point (B), which leads to a reduction of the switching speed.

SUMMARY OF THE INVENTION

Briefly, and in accordance with the present invention, the response time of an ordinary or differential transistor switching circuit controlled by the charging of a capacitor is shortened by rapidly charging the capacitor through a transistor connected in parallel with the normal charging resistor of the capacitor. The transistor is rendered conductive before the differential switching region is reached in response to the capacitor charge reaching a predetermined level, whereby the charging curve thereafter follows a steep rise to sharply reduce the switching time.

DETAILED DESCRIPTION OF THE PREFERRED EMBODIMENTS

Figure 1:
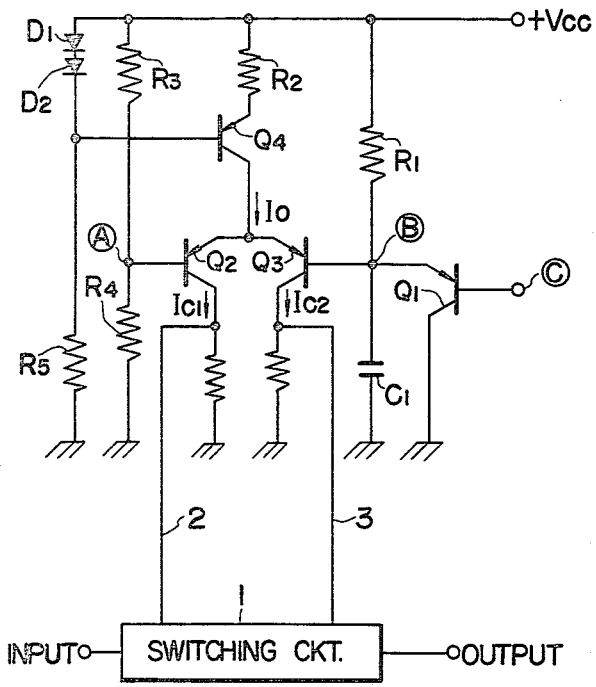
FIG. 1 shows a schematic diagram of a conventional differential switching circuit.
Figure 2:
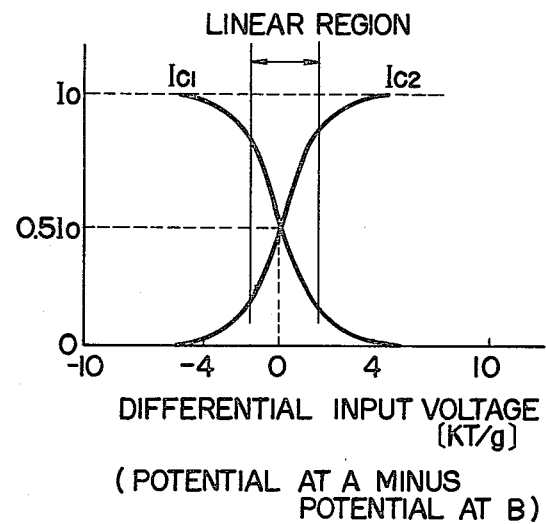
FIG. 2 shows a graphical representation of the switching characteristics of the circuit of FIG. 1.
Figure 3:
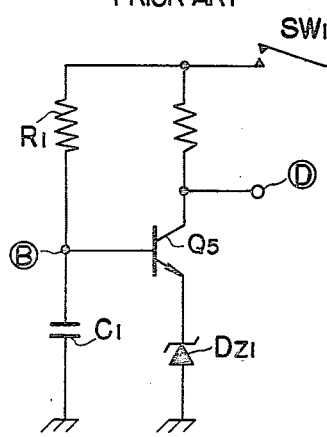
FIG. 3 shows a conventional ordinary transistor switching circuit.
Figure 4:
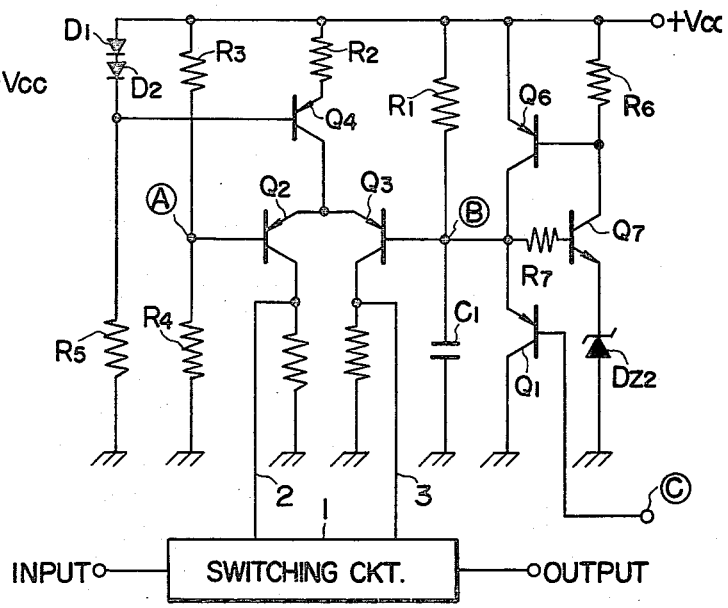
FIGS. 4 and 5 show schematic diagrams of switching circuits according to two embodiments of this invention.

A first embodiment of this invention is shown in FIG. 4, in which those components which have been described above with reference to FIG. 1 are designated by the same reference numerals or characters.

Referring to FIG. 4, the collector of transistor $Q_7$ is connected through resistor $R_6$ to the power supply +Vcc, and the emitter of $Q_7$ is grounded through a Zener diode $D_{Z2}$. The base of $Q_7$ is connected to terminal point (B) through resistor $R_7$. The emitter of transistor $Q_6$ is connected directly to the power supply +Vcc, its collector is connected to terminal point (B), and its base is connected to the junction between $R_6$ and the collector of $Q_7$.

Figure 6:
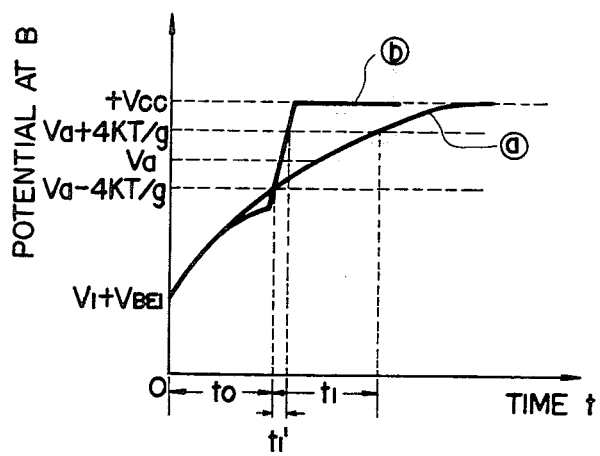
FIG. 6 shows a comparative plot of the response characteristics of the circuits shown in FIGS. 1 and 4.

In operation, when a voltage applied to switching terminal (C) is suspended, the voltage at point (B) builds up according to the time constant determined by the values of resistor $R_1$ and capacitor $C_1$. If the base-emitter voltage of $Q_7$ and the breakdown voltage of Zener diode $D_{Z2}$ are represented by $V_{BE7}$ and $V_{D2}$, respectively, then when the potential at point (B) exceeds the value ($V_{DZ2}+V_{BE7}$), transistor $Q_7$ is rendered conductive and a voltage drop occurs across resistor $R_6$. Such voltage drop is applied to the base of transistor $Q_6$ which renders it conductive. Accordingly, a large charging current flows through $Q_6$ until the potential at point (B) becomes substantially equal to the supply voltage +Vcc, and as the voltage drop across resistor $R_7$ is added to the base potential of $Q_7$, the potential at point (B) follows a steep build-up characteristic as shown by curve (b) in FIG. 6. As a result, the differential switching time is shortened from $t_1$ to $t_1'$.

Figure 5:
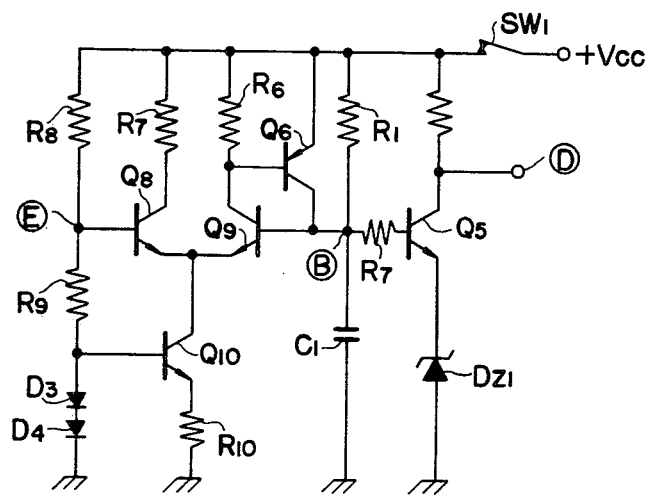

In the embodiment of FIG. 5 the technical concept of the invention is applied to an ordinary transistor switching circuit. Transistors $Q_8$ and $Q_9$ are connected in differential arrangement, and a constant current source is formed by transistor $Q_{10}$, resistor $R_{10}$ and diodes $D_3$ and $D_4$. The base of transistor $Q_6$ is connected to the collector of $Q_9$, the emitter thereof is connected to the power supply +Vcc, and the collector is connected to point (B).

Figure 7:
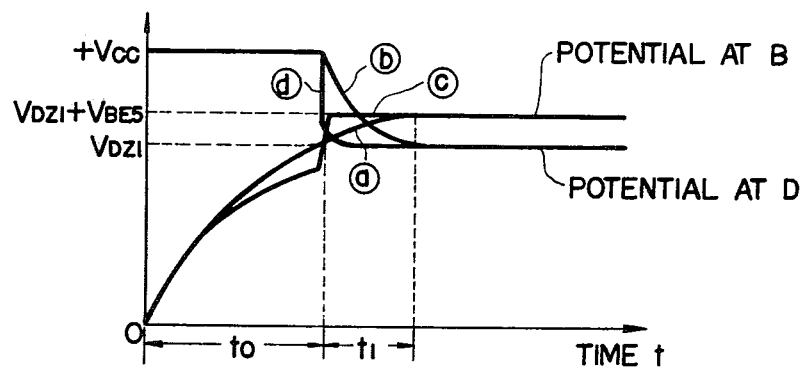
FIG. 7 shows a comparative plot of the response characteristics of the circuits shown in FIGS. 3 and 5.

Upon the closure of switch $SW_1$ a bias is applied to the base of $Q_8$ to render it conductive, while $Q_9$ remains non-conductive. The potential at point (B) also begins to build up upon the closure of $SW_1$, and when such potential becomes higher than the potential at point (E) by an amount equal to 4 KT/2 or more, transistor $Q_9$ is rendered conductive and transistor $Q_8$ is cut off. Accordingly, because of the voltage drop across resistor $R_6$ transistor $Q_6$ is rendered conductive, and a large charging current flow therethrough. As a result, the potential at point (B) follows curve (c) in FIG. 7, transistor $Q_5$ is quickly rendered conductive, and the output voltage at point (D) has a rapid response characteristic as indicated by curve (d) in FIG. 7.

In the above-described embodiments a transistor $Q_6$ is employed as a variable impedance element connected in parallel to resistor $R_1$ in the capacitor charging circuit, but the same effect can obviously be obtained with a thyristor. In this case the anode, cathode and gate of the thyristor would be connected just as the emitter, collector and base of transistor $Q_6$, respectively.

What is claimed is:

1. In a transistor switching circuit including first switching means comprising at least one switching transistor, a capacitor connected between the base of said transistor and ground, a source of charging current for said capacitor, a resistor connected between said source and said capacitor, and second switching means for controlling the application of said charging current to said capacitor, whereby the conduction state of said transistor is reversed as the potential on said capacitor passes through a switching region, the improvement characterized by:
   (a) a variable impedance element connected in parallel with said resistor, and comprising a second transistor whose emitter-collector path is connected between said source and said capacitor, and
   (b) means for abruptly lowering the impedance of said element in response to the charge on said capacitor reaching a predetermined level lower than that of said switching region, and comprising a third transistor whose collector is directly connected to the base of said second transistor and resistively connected to said source, whose base is resistively connected to said capacitor, and whose emitter is connected to ground through a Zener diode, whereby the charging characteristic for said capacitor has an increased slope and the time required for the charge on said capacitor to pass through said switching region is reduced.

2. A switching circuit as defined in claim 1, wherein said at least one switching transistor comprises a first pair of differentially connected transistors, and said second switching means comprises a fourth transistor having its emitter-collector path connected across said capacitor, and a switching signal input terminal connected to its base.

3. In a transistor switching circuit including first switching means comprising at least one switching transistor, a capacitor connected between the base of said transistor and ground, a source of charging current for said capacitor, a resistor connected between said source and said capacitor, and second switching means for controlling the application of said charging current to said capacitor, whereby the conduction state of said transistor is reversed as the potential on said capacitor passes through a switching region, the improvement characterized by:
   (a) a variable impedance element connected in parallel with said resistor between said source and said capacitor, and comprising a second transistor whose emitter-collector path is connected between said source and said capacitor, and
   (b) means for abruptly lowering the impedance of said element in response to the charge on said capacitor reaching a predetermined level lower than that of said switching region, and comprising a pair of differentially connected third and fourth transistors, the base of said third transistor being connected to said capacitor and the collector of said third transistor being connected to the base of said second transistor, and the emitters of said third and fourth transistors being connected in common to a constant current source, whereby the charging characteristic for said capacitor has an increased slope and the time required for the charge on said capacitor to pass through said switching region is reduced.

* * * * *